(12) United States Patent
Yo et al.

(10) Patent No.: US 8,146,969 B2
(45) Date of Patent: Apr. 3, 2012

(54) PICK-AND-PLACE MODULE FOR TEST HANDLERS

(75) Inventors: Dong Hyun Yo, Gyeonggi-do (KR); Hyun Song, Seoul (KR)

(73) Assignee: Techwing Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/784,148

(22) Filed: May 20, 2010

(65) Prior Publication Data

US 2010/0229660 A1 Sep. 16, 2010

Related U.S. Application Data

(63) Continuation of application No. PCT/KR2008/006761, filed on Nov. 17, 2008.

(30) Foreign Application Priority Data

Nov. 23, 2007 (KR) ........................ 10-2007-0120476

(51) Int. Cl.
*A47B 97/00* (2006.01)
(52) U.S. Cl. ........................................... 294/65
(58) Field of Classification Search .................. 294/64.1, 294/64.2, 65; 414/749.5, 752.1, 737; 901/40
See application file for complete search history.

(56) References Cited

U.S. PATENT DOCUMENTS

| | | | | |
|---|---|---|---|---|
| 5,290,134 A * | 3/1994 | Baba | .............................. | 414/404 |
| 5,943,842 A * | 8/1999 | de Koning et al. | .............. | 53/247 |
| 6,137,286 A * | 10/2000 | Ho et al. | ................... | 324/757.01 |
| 6,870,360 B2 * | 3/2005 | Hwang | ................... | 324/750.19 |
| 7,390,040 B2 * | 6/2008 | Subotincic | ....................... | 294/65 |
| 2002/0153735 A1 * | 10/2002 | Kress | ............................. | 294/87.1 |
| 2003/0140475 A1 * | 7/2003 | Wah et al. | .................... | 29/401.1 |
| 2006/0187647 A1 * | 8/2006 | Iy et al. | ......................... | 361/719 |

FOREIGN PATENT DOCUMENTS

| | | |
|---|---|---|
| JP | 2004-39706 | 2/2004 |
| KR | 10-2006-0068675 | 6/2006 |
| KR | 10-2007-0106145 | 11/2007 |

* cited by examiner

*Primary Examiner* — Saul Rodriguez
*Assistant Examiner* — Stephen Vu
(74) *Attorney, Agent, or Firm* — BainwoodHuang (57) ABSTRACT

A pick-and-place module for test handlers includes a main body, and a kit. The main body has N-th vacuum paths (where N is plural). The kit has M-th pickers. The M-th pickers are provided so as respectively correspond to M-th vacuum passages (where $1 \leq M \leq N$), which are formed to respectively correspond to all or some of the N-th vacuum paths formed in the main body, and holds semiconductor devices or releasing the held semiconductor devices using vacuum pressures. The kit is detachably mounted to the main body.

3 Claims, 9 Drawing Sheets

PICK-AND-PLACE MODULE FOR TEST HANDLERS

This application is a Continuation Application of PCT International Application No. PCT/KR2008/006761 filed on Nov. 17, 2008, which designated the United States.

CROSS-REFERENCE(S) TO RELATED APPLICATION(S)

The present invention claims priority of Korean Patent Applications No. 10-2007-0120476, filed on Nov. 23, 2007, which is incorporated herein by reference.

FIELD OF THE INVENTION

The present invention relates generally to a pick-and-place module that is used for test handlers. The term 'pick-and-place module' refers to a single module that constitutes a pick-and-place device, which is configured to transfer semiconductor devices between different loading or aligning elements and to load and align the semiconductor devices.

BACKGROUND OF THE INVENTION

Manufactured semiconductor devices are tested by a tester so as to allow good and bad devices to be distinguished, so that only the good devices are marketed. In this case, a kind of automatic equipment called a 'test handler' is used to support the test processes using the tester. Such a test handler includes a pick-and-place device, which is used to transfer semiconductor devices between different loading or aligning elements, such as customer trays, test trays, aligners, buffers and sorting tables. The pick-and-place device has at least one pick-and-place module.

Furthermore, the pick-and-place module includes a plurality of pickers, which are arranged in a line to perform the operation of sucking and holding semiconductor devices or releasing the held semiconductor devices using vacuum pressures.

Meanwhile, the customer tray is used to load semiconductor devices for the purpose of storing the semiconductor devices. For this reason, it is preferred that the customer tray be configured so as to load as large a number of semiconductor devices as possible. As the sizes of semiconductor devices having the same function have been becoming smaller due to the development of semiconductor manufacturing process technology, increasing the number of semiconductor devices which can be loaded onto the same customer tray (which is of a limited area) became possible. For example, under the assumption that eight semiconductor devices can be conventionally loaded onto a customer tray in a single row, if the sizes of semiconductor devices become smaller due to the development of semiconductor manufacturing process technology, it becomes possible to load ten or twelve semiconductor devices onto the same customer tray in a single row. In this case, the interval between the semiconductor devices which are loaded onto the customer tray ten or twelve per row becomes narrower than the interval between those semiconductor devices which are loaded onto the customer tray eight per row.

Accordingly, when a test handler supplies customer trays, and when the customer trays change from ones on which eight semiconductor devices are loaded in a single row to ones on which ten or twelve semiconductor devices are loaded in a single row, or vice-versa, the intervals between pickers provided in the pick-and-place module of the test handler must also be adjusted. However, there is no means for adjusting the intervals between pickers in order to achieve applicability to all customer trays, though they differ from each other in the number of semiconductor devices loadable in the same area. Accordingly, when the customer trays having different capacities are supplied, changes to corresponding pick-and-place modules must be performed.

Furthermore, the time required to transfer semiconductor devices can be reduced only when a single pick-and-place module is provided with a plurality of pickers corresponding to the number that is necessary to hold all of the semiconductor devices, which are loaded on a customer tray in a single row. In the case where a customer tray, on which eight semiconductor devices are loaded in a single row, is replaced with a customer tray on which ten or twelve semiconductor devices are loaded in a single row or vice-versa, the number of pickers must be increased or reduced. However, in a conventional pick-and-place module, the number of pickers cannot be increased or reduced, so that a problem occurs in that the entire pick-and-place module must be replaced.

The above-described problems cause the reuse rate of resources to be reduced, with the result that resources are wasted and, in addition, a replacement cost is increased.

SUMMARY OF THE INVENTION

Accordingly, the present invention has been made keeping in mind the above problems occurring in the prior art, and the present invention is intended to provide a technology which enables only part of a pick-and-place module to be replaced, thus achieving applicability to all customer trays having different loading capacities.

In accordance with an embodiment of the present invention, there is provided a pick-and-place module for test handlers, including: a main body having N-th vacuum paths (where N is plural); and a kit having M-th pickers, the M-th pickers being provided so as respectively correspond to M-th vacuum passages (where $1 \leqq M \leqq N$), which are formed to respectively correspond to all or some of the N-th vacuum paths formed in the main body, and holding semiconductor devices or releasing the held semiconductor devices using vacuum pressures; wherein the kit is detachably mounted to the main body.

Furthermore, it is preferred that (N−M)-th vacuum path 10 parts, which are formed on the main body so as not to correspond to the M-th vacuum passages, be closed by the upper surface of the kit when the kit is mounted to the main body.

Furthermore, when the pick-and-place module is formed by coupling a plurality of the pick-and-place modules to each other, it is preferred that an intermediate pick-and-place module be formed such that a main body and a kit thereof has an "I" shape, and that pick-and-place modules, which are arranged on both sides of the intermediate pick-and-place module, be formed such that main bodies and kits thereof have a "]" shape or a "[" shape.

Furthermore, the M-th pickers are configured such that intervals between outmost pickers are identical to each other even when N≠M or N=M.

In accordance with another embodiment of the present invention, there is provided a pick-and-place module for test handlers, including: a main body comprising: N-th pickers (where N is plural) for holding semiconductor devices or releasing the held semiconductor devices using vacuum pressures; and a mounting member for enabling L-th pickers (where $0 \leqq L < N$) among the N-th pickers to be distinguished from M-th remaining pickers, that is, (N−L)-th pickers, and to be separately located and mounted; and a kit detachably mounted to the main body, and configured to adjust lateral intervals between the M-th pickers.

Furthermore, it is preferred that the lateral intervals between the M-th pickers be adjusted in such a way that respective lateral interval adjustment protrusions are formed on N-th pickers, and M-th interval adjustment depressions, into which the respective lateral interval adjustment protrusions are inserted, are formed in the kit.

Furthermore, it is preferred that respective mounting protrusions be formed on the N-th pickers so that the N-th pickers are mounted to the mounting member, and that the mounting member be configured such that a long mounting groove, which is laterally formed such that the mounting protrusions formed on the M-th pickers are inserted therein, and such that at least one end portion of the mounting groove is formed to laterally extend to a location higher than that of the lateral portion of the mounting groove so that the L-th pickers are distinguished from the M-th pickers and are separately mounted.

Furthermore, the kit includes a mounting plate mounted to the main body, and a lateral interval adjustment member integrated with the mounting plate and configured to adjust the lateral intervals between the M-th pickers.

Furthermore, it is preferred that the lateral interval adjustment member include partition walls, which are inserted between the M-th pickers so that the M-th pickers are spaced apart from each other at regular intervals.

Furthermore, it is preferred that the N-th pickers include respective elastic members, and apply elastic forces to first partition walls so that the pickers are in close contact with second partition walls and are aligned.

Furthermore, it is preferred that the respective vertical movement prevention depressions be formed in the N-th pickers so as to prevent the pickers from being vertically moved, and that the vertical movement prevention protrusions, which are inserted into respective vertical movement prevention depressions, be formed in the lateral interval adjustment member.

Furthermore, it is preferred that a long mounting slot be laterally formed in the mounting member to pass through the mounting member, and that respective engaging protrusions be formed on the N-th pickers so as to prevent the pickers from being downwardly moved.

Furthermore, it is preferred that the mounting member include distinction mounters, which enable the L-th pickers to be distinguished from the M-th pickers and to be separately mounted.

In accordance with still another embodiment of the present invention, there is provided a pick-and-place module for test handlers, including: a main body; N-th pickers (where N is plural) for holding semiconductor devices or releasing the held semiconductor devices using vacuum pressures; and a kit for enabling L-th pickers (where 0≦L<N) among the N-th pickers to be distinguished from M-th remaining pickers, that is, (N−L)-th pickers, and to be separately located and mounted, and enabling lateral intervals between the M-th pickers to be adjusted.

Furthermore, it is preferred that the kit include partition walls, which are inserted between the M-th pickers so that the M-th pickers are spaced apart from each other at regular intervals.

Furthermore, it is preferred that the partition walls include respective elastic members, and apply elastic forces to first partition walls so that the pickers are in close contact with second partition walls and are aligned.

Furthermore, it is preferred that respective vertical movement prevention depressions be formed in the N-th pickers so as to prevent the pickers from being vertically moved, and that vertical movement prevention protrusions, which are inserted into respective vertical movement prevention depressions, be formed in the partition walls.

Furthermore, it is preferred that the kit include distinction mounters, which enable the L-th pickers to be distinguished from the M-th pickers and to be separately mounted.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Preferred embodiments of a pick-and-place module for test handlers (hereinafter referred to as a 'pick-and-place module') in accordance with the present invention are described in detail with reference to the accompanying drawings. For ease of description, repeated descriptions are omitted or epitomized if possible.

<First Embodiment>

Figure 1:
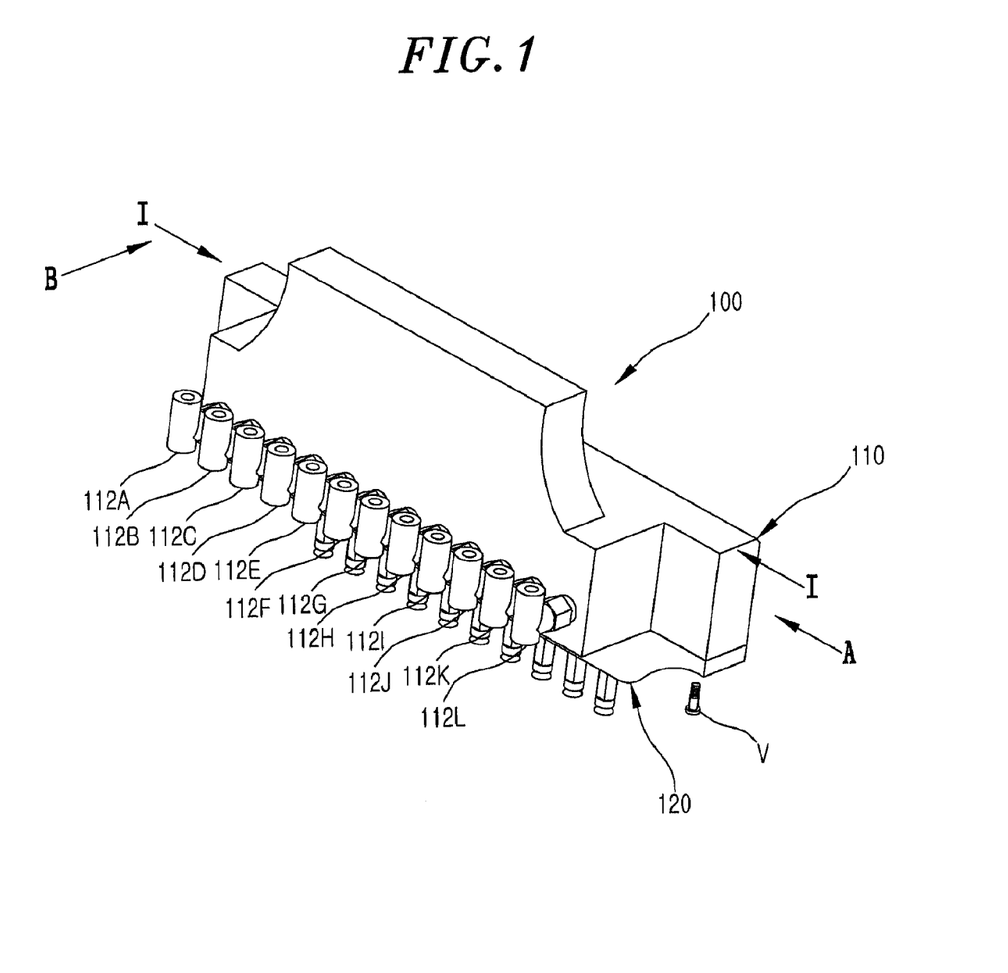
FIG. 1 is a schematic perspective view showing a pick-and-place module in accordance with a first embodiment of the present invention.
Figure 2:
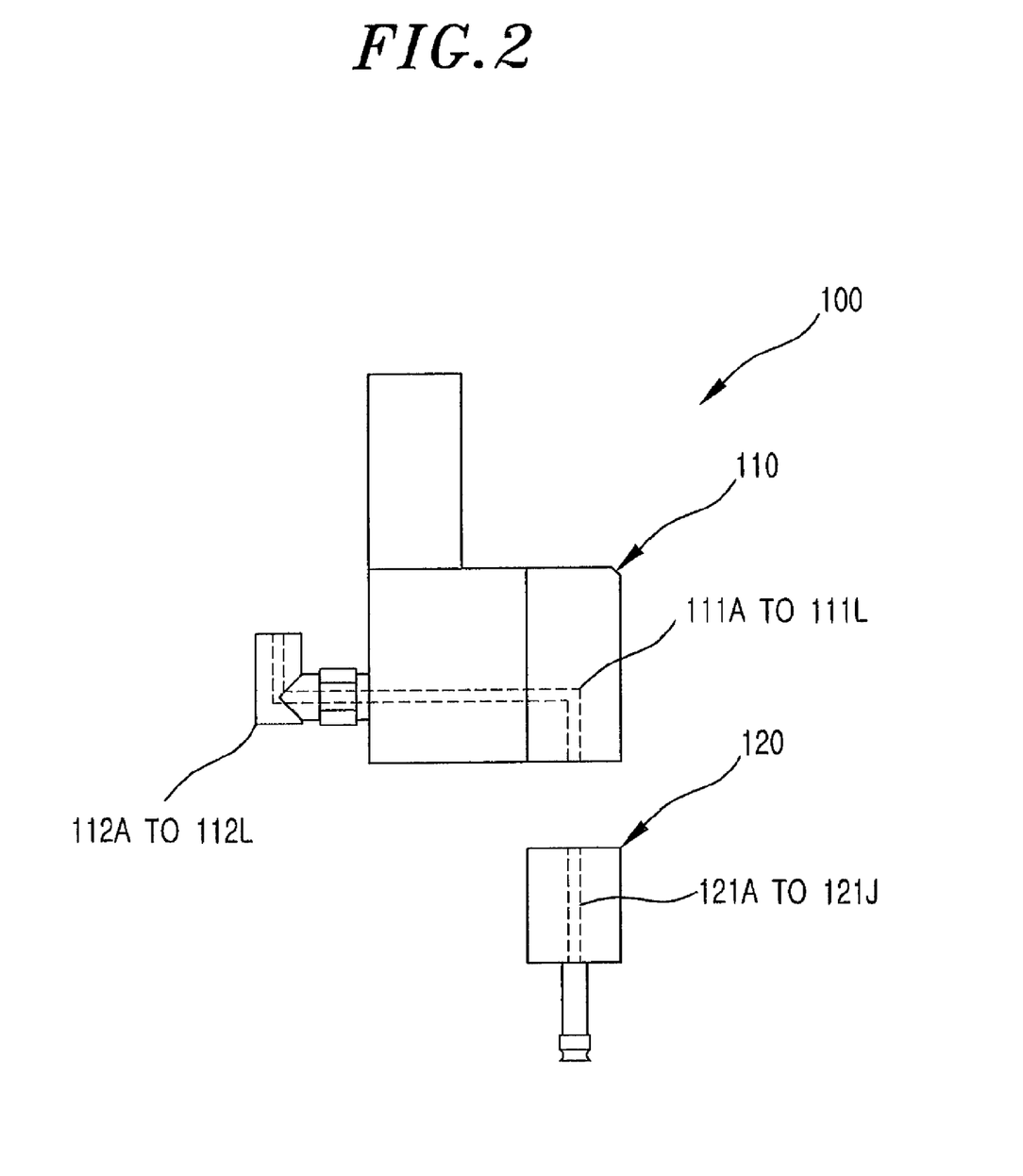
FIG. 2 is a side conceptual view when the pick-and-place module of FIG. 1 viewed in the direction of 'A' in the state in which a part thereof is dissembled.
Figure 3:
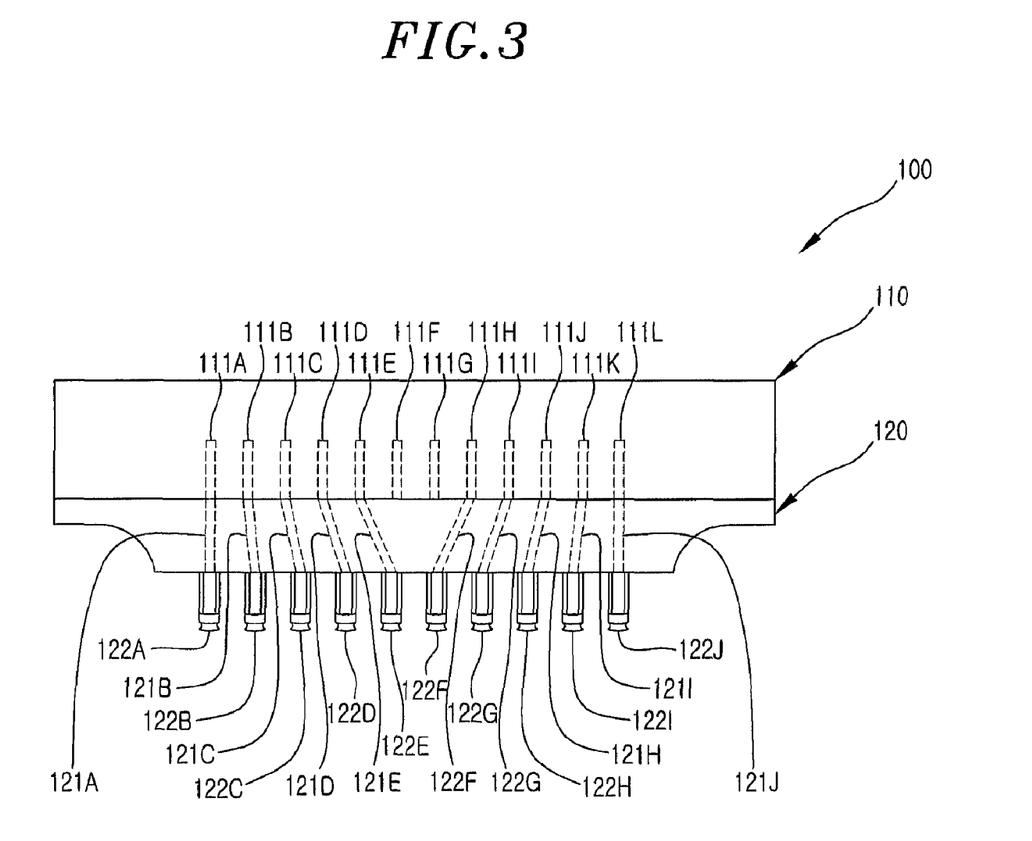
FIG. 3 is a schematic cut view when the pick-and-place module of FIG. 1 taken along line I-I and viewed in the direction of 'B' in order to show the movement paths of vacuum pressure.

FIG. 1 is a schematic perspective view showing a pick-and-place module 100 in accordance with a first embodiment of the present invention, FIG. 2 is a side conceptual view when the pick-and-place module 100 of FIG. 1 is viewed in the direction of 'A' in the state in which a part thereof is dissembled, and FIG. 3 is a schematic cut view when the pick-and-place module 100 of FIG. 1 taken along line I-I and viewed in the direction of 'B' in order to show the movement paths of vacuum pressure.

Referring to FIG. 1, the pick-and-place module 100 of the present embodiment includes a main body 110, which is mounted to an X-Y robot (not shown), and a kit 120, which is detachably mounted to the main body 110.

As shown in FIG. 3, twelve vacuum paths $111_A$ to $111_L$, which are connected to respectively correspond to twelve vacuum lines (not shown), which are the tubes formed in the main body 110 so as to have a "⊺" shape (refer to FIG. 2). Referring to FIG. 1, twelve connection blocks $112_A$ to $112_L$, are provided such that the twelve vacuum lines can be connected to respectively correspond to the twelve vacuum paths $111_A$ to $111_L$.

Referring to FIGS. 2 and 3, ten vacuum passage 121A to 121J, which correspond to ten vacuum paths 111A to 111E and 111H to 111L, among the twelve vacuum paths 111A to 111L, are vertically formed on the kit 120. Ten pickers 122A to 122J are provided so as to correspond to the ten vacuum passages 121A to 121J, and function to hold semiconductor devices or remove the held semiconductor devices using vacuum pressures that are transmitted via vacuum pressure transmission paths (vacuum lines-connection blocks-vacuum paths-vacuum passages). Here, the two remaining vacuum paths 111F and 111G, other than the ten vacuum paths 111A to 111E and 111H to 111L that communicate with the ten vacuum passages 121A to 121J among the twelve vacuum paths 111A to 111L, are closed by the upper surface of the kit 120 when the kit 120 is mounted to the main body 110 using bolts V.

Figure 4:
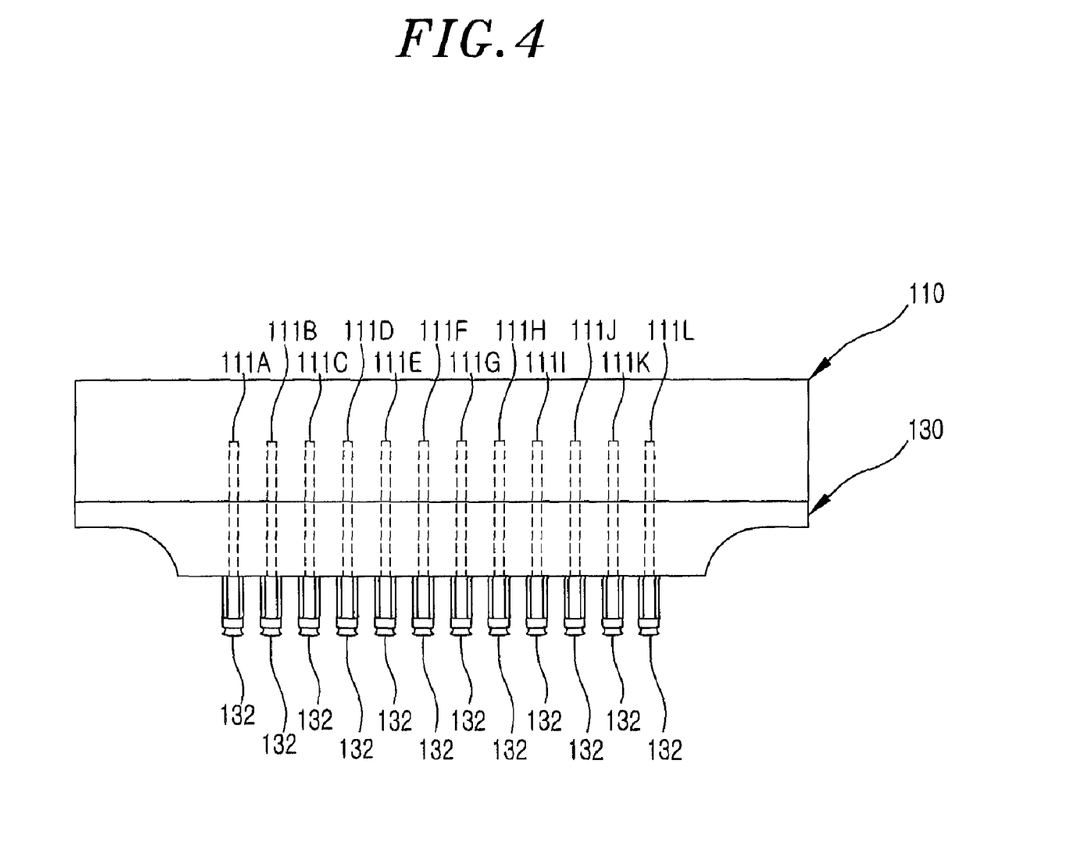
FIG. 4 is a view showing an example in which some other kit is applied to the main body of the pick-and-place module of FIG. 1.

Although the kit 120 having ten pickers $122_A$ to $122_J$ is shown in FIGS. 1 to 3, it can be seen that any kit having one to twelve pickers may be applied to the main body 110 according to embodiments. As an example, FIG. 4 shows the case where a kit 130 having a total of twelve pickers 132 is applied to the main body 110.

Figure 5:
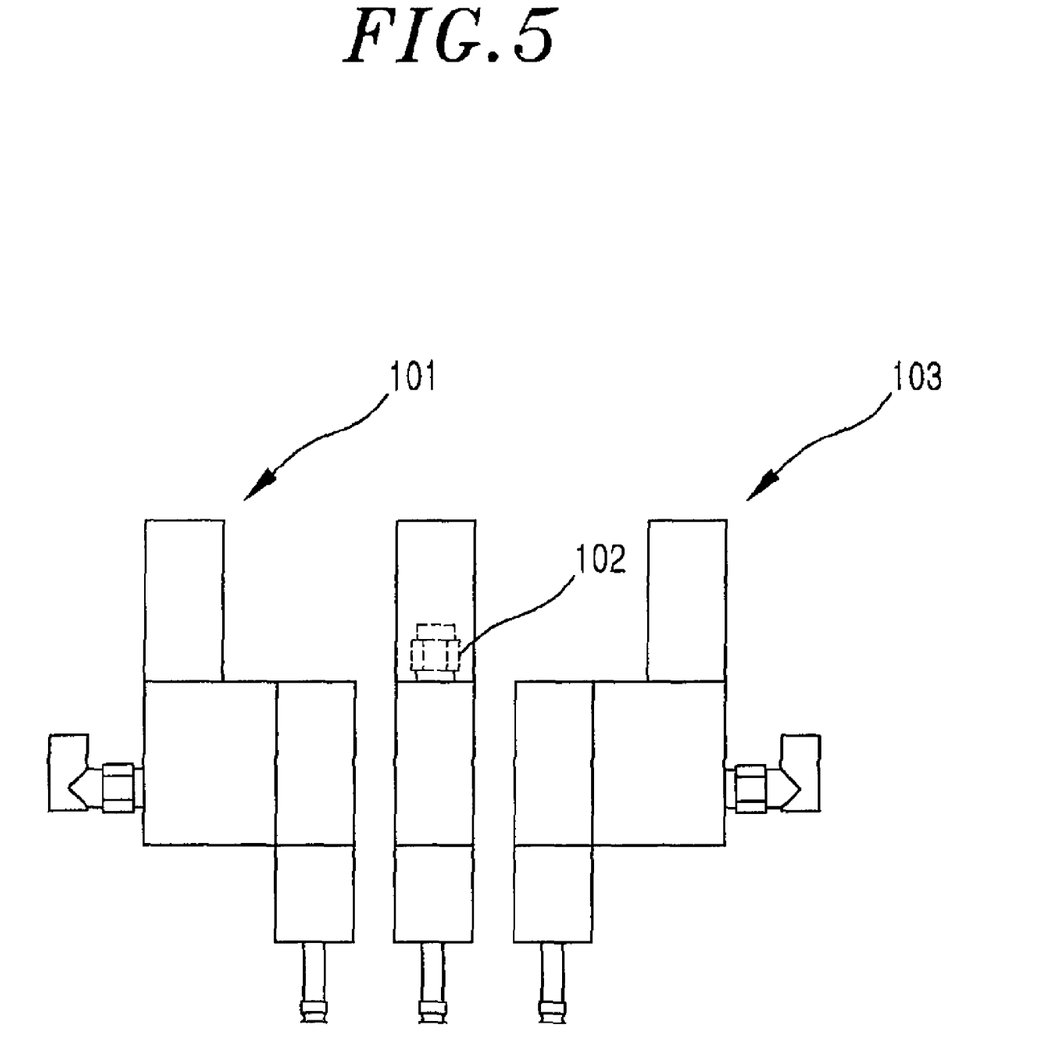
FIG. 5 is a side view showing an arrangement of three pick-and-place modules.

For reference, FIG. 5 shows a side view of a structure in which three pick-and-place module 101, 102 and 103 according to the present embodiment are arranged. A typical pick-and-place device includes one or more pick-and-place modules. Accordingly, when a pick-and-place device having three pick-and-place modules 101, 102 and 103 is configured, the three pick-and-place modules 101, 102 and 103 may be appropriately arranged regardless of the sizes of the connection blocks if the main body and the kit of the intermediate pick-and-place module 102 are disposed to have an "⊺" shape and if the main body and the kit of the side pick-and-place module 101 or 103 are disposed to have a "⌐" shape or a "⌐" shape, as shown FIG. 5.

Particularly, in the present embodiment, the kits 120 are coupled to the respective main bodies 110 upwards from the lower sides of the main bodies 110, so that the replacement of the kits can be performed by detaching only the kits even when the three pick-and-place modules 101, 102 and 103 are arranged.

<Second Embodiment>

Figure 6A:
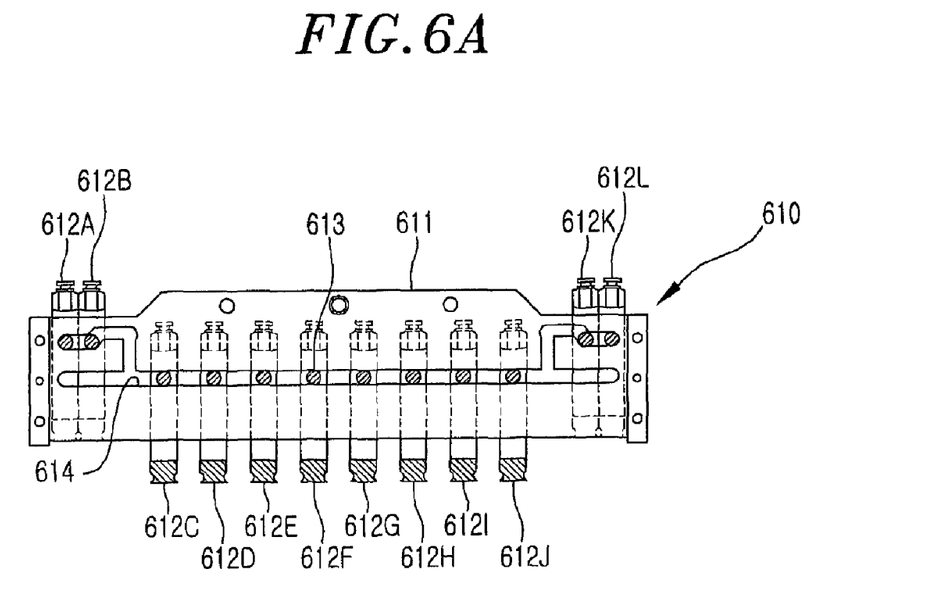
FIGS. 6A and 6B are schematic views showing a pick-and-place module in accordance with a second embodiment of the present invention.
Figure 6B:
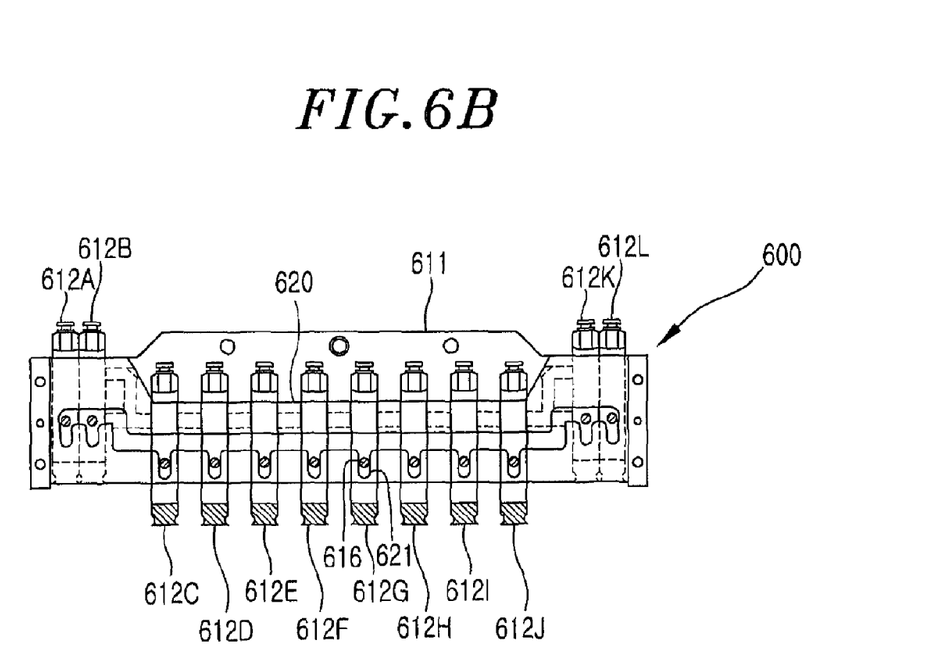

FIG. 6A is a rear view showing the state in which the kit of a pick-and-place module according to a second embodiment of the present invention is removed, and FIG. 6B is a front view showing the state in which the kit 620 of the pick-and-place module 600 according to the second embodiment of the present invention is mounted.

Referring to FIGS. 6A and 6B, the pick-and-place module 600 according to the present embodiment includes a main body 610 and a kit 620.

The main body 610 includes a plate-shaped mounting member 611, and twelve pickers $612_A$ to $612_L$.

Referring to FIG. 6A, a long mounting groove 614 is laterally formed in the mounting member 611. Furthermore, both end portions of the mounting groove 614 are formed to extend to respective locations higher than those of the lateral portion of the mounting groove 614, and thus two pairs of pickers $612_A$ and $612_B$ and $612_K$ and $612_L$ can be separately located in the respective end portions.

Twelve mounting protrusions 613 are formed on the respective pickers $612_A$ to $612_L$ so as to be inserted into the mounting groove 614 in the rearward direction of the mounting member 611. Accordingly, when the mounting protrusions 613 are inserted into the mounting groove 614, the pickers $612_A$ to $612_L$ are mounted to the mounting member 611. Furthermore, as shown in FIG. 6A, when the mounting protrusions 613 are inserted into the mounting groove 614, the two pairs of pickers $612_A$ and $612_B$ and $612_K$ and $612_L$ are inserted into the respective end portions of the mounting groove 614. Accordingly, the two pairs of pickers $612_A$ and $612_B$ and $612_K$ and $612_L$ are distinguished from the pickers $612_C$ to $612_J$, which are arranged in the lateral portion of the mounting groove 614, and are separately located to relatively higher locations. Furthermore, referring to FIG. 6B, twelve lateral interval adjustment protrusions 616 are formed on the respective pickers $612_A$ to $612_L$ in the direction forward of the mounting member 611. For reference, vacuum lines (not shown), which are provided from a vacuum pump (not shown), are directly connected to the respective pickers $612_A$ to $612_L$.

Eight interval adjustment depressions 621, into which eight lateral interval adjustment protrusions 616 are respectively inserted, are formed in the kit 620 so as to communicate with the lateral portion of the mounting groove 614. Accordingly, when the kit 620 is mounted to the mounting member 611, the lateral intervals of the eight pickers $612_C$ to $612_J$ can be adjusted and maintained.

Figure 7A:
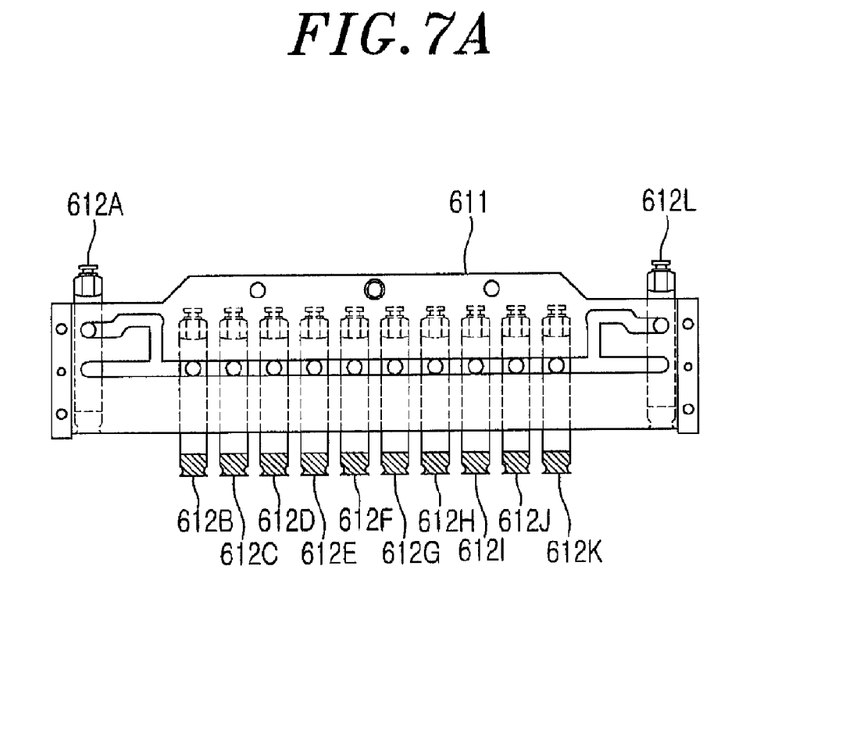
FIGS. 7A and 7B are views showing an example in which some other kit is applied to the main body of the pick-and-place module of FIGS. 6A and 6B.
Figure 7B:
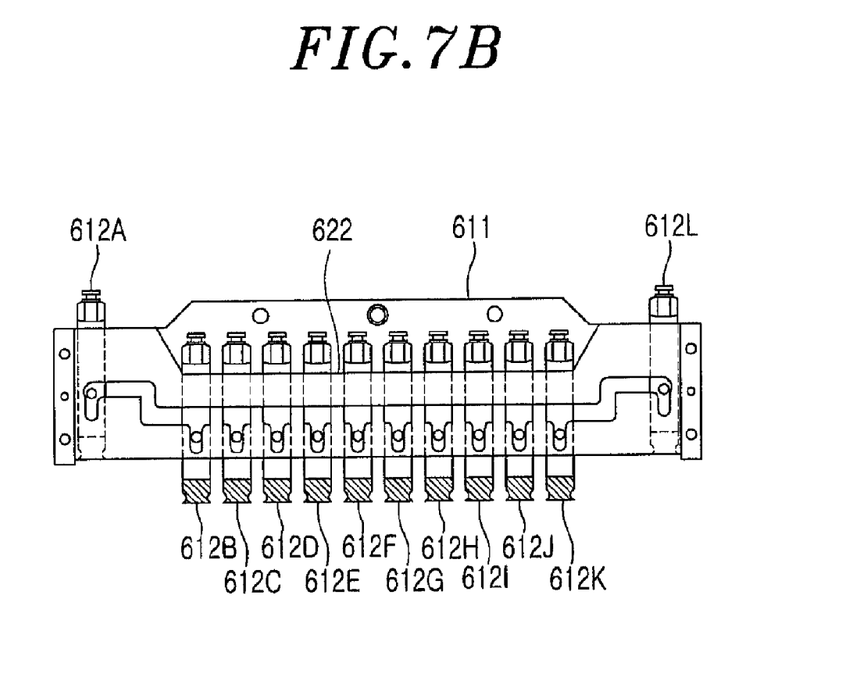

FIGS. 6A and 6B show the case where a kit 620 to be mounted to the main body 610 is applied when it is required to use the eight pickers $612_C$ to $612_J$ but it is not required to use the four remaining pickers $612_A$, $612_B$, $612_K$ and $612_L$. In contrast, FIGS. 7A and 7B are a rear view and a front view showing the case where a kit 622 to be mounted to the main body 610 is applied when it is required to use the ten pickers $612_B$ to $612_K$ but it is not required to use the two remaining pickers $612_A$ and $612_L$.

That is, according to the present embodiment, the holding capacity of the pick-and-place module 600 can be varied by replacing only the kit 620.

<Third Embodiment>

Figure 8:
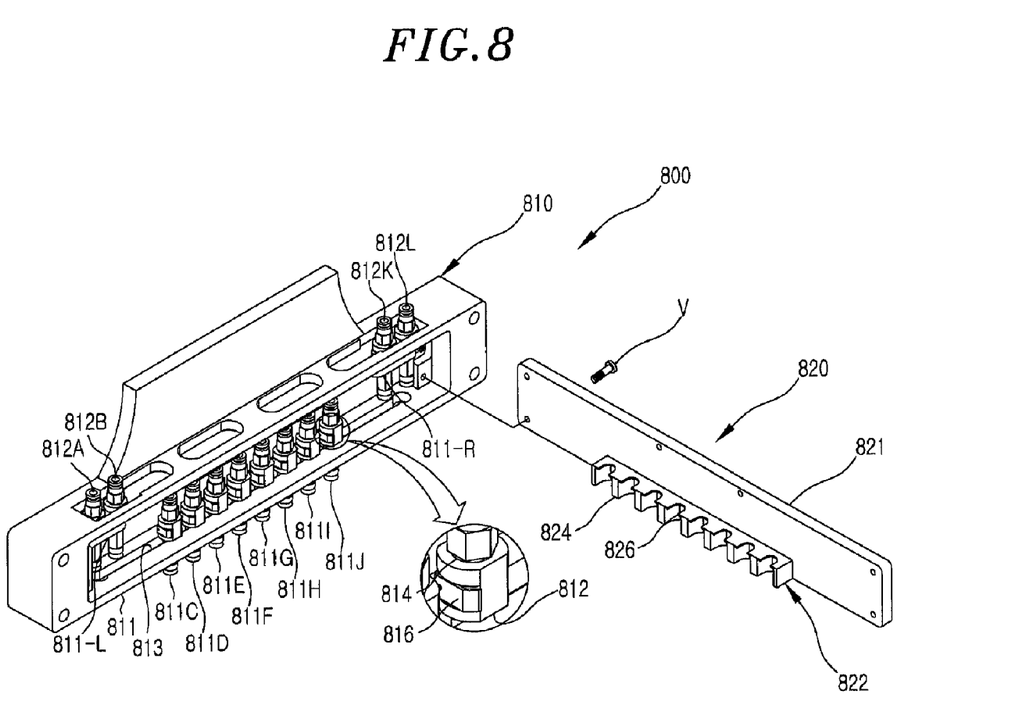
FIG. 8 is a schematic view showing a pick-and-place module in accordance with a third embodiment of the present invention.

FIG. 8 is an exploded perspective view showing a pick-and-place module 800 in accordance with a third embodiment of the present invention.

Referring to FIG. 8, the pick-and-place module 800 of the present embodiment includes a main body 810 and a kit 820.

The main body 810 includes a mounting member 811, and twelve pickers $812_A$ to $812_L$.

A mounting slot 813 is laterally formed in the mounting member 811 and passes through the lower portion of the mounting member 811. Division mounters 811-R and 811-L are provided in both end portions of the main body 810 so that the unused pickers $812_A$, $812_B$, $812_K$ and $812_L$ can be distinguished from the used pickers $812_C$ to $812_J$ and can be separately mounted to relatively higher locations.

Twelve engaging protrusions 812 are formed on the respective pickers $812_A$ to $812_L$ so as to prevent the pickers $812_A$ to $812_L$ from being downwardly moved, and thus the pickers $812_A$ to $812_L$, which are mounted to pass through the mounting slot 813, are engaged with the engaging protrusions 812. Furthermore, twelve vertical movement prevention depressions 814 are formed in the respective pickers $812_A$ to $812_L$ so as to prevent the pickers $812_A$ to $812_L$ from being vertically moved. Furthermore, elastic members 816 are mounted to the respective pickers $812_A$ to $812_L$.

The kit 820 includes a plate-shape mounting plate 821, and a lateral interval adjustment member 822.

The mounting plate 821 is coupled to the main body 810 using bolts V.

The lateral interval adjustment member 822 is integrated with the mounting plate 821 or is integrally formed with the mounting plate 821, and is provided to adjust the lateral intervals between the eight pickers $812_C$ to $812_J$. Partition walls 824, which are inserted between the eight pickers $812_C$ to $812_J$ so that the eight pickers $812_C$ to $812_J$ can be spaced apart from each other at regular intervals, are formed in the lateral interval adjustment member 822. Vertical movement prevention protrusions 826, which are inserted into the vertical movement prevention depressions 814 of the pickers $812_C$ to $812_J$, are formed on the lateral interval adjustment member 822.

In the case where the pickers $812_C$ to $812_J$ are mounted to be spaced apart from each other at regular intervals by the partition walls 824, the elastic members 816 apply elastic forces to the partition walls 824, which are formed on the first side of the elastic members 816, thus enabling the pickers $812_C$ to $812_J$ to be in close contact with the partition walls 824, which are formed on the second side of the elastic members 816, and to be aligned.

In the case of the above-described pick-and-place module 800 according to the present embodiment, the holding capacity of the pick-and-place module 800 can be varied by replacing only the kit 820.

<Fourth Embodiment>

Figure 9:
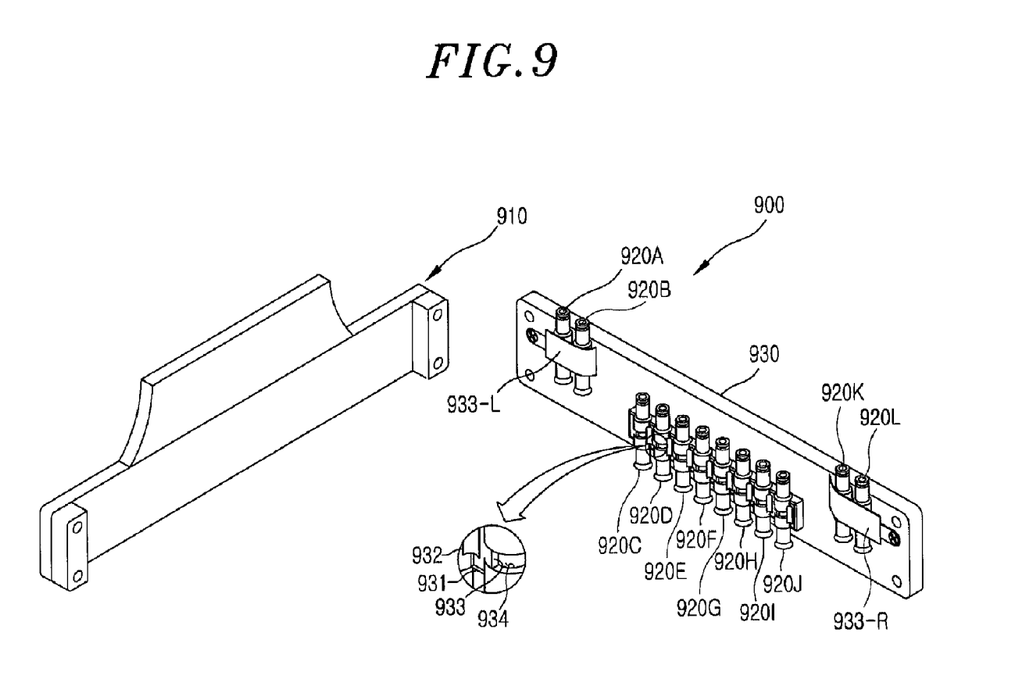
FIG. 9 is a schematic view showing a pick-and-place module in accordance with a fourth embodiment of the present invention.

FIG. 9 is an exploded view showing a pick-and-place module 900 in accordance with a fourth embodiment of the present invention.

Referring to FIG. 9, the pick-and-place module 900 of the present invention includes a main body 910, twelve pickers $920_A$ to $920_L$, and a kit 930.

The main body 910 is provided to have a plate shape.

Twelve vertical movement prevention depressions 934 are formed in the pickers $920_A$ to $920_L$ so as to prevent the pickers $920_A$ to $920_L$ from being vertically moved.

The kit 930 is mounted to the main body 910 using bolts and is provided to have a plate shape. Partition walls 931 are formed on the kit 930 so that the used eight pickers $920_C$ to $920_J$ can be spaced apart from each other at regular intervals. Elastic members 932 are mounted to the respective partition walls 931 and are configured to apply elastic forces to the pickers $920_C$ to $920_J$ in one direction, thus enabling the pickers $920_C$ to $920_J$ to be in close contact with first partition walls 931 and to be aligned. Furthermore, vertical movement prevention protrusions 933, which are inserted into vertical movement prevention depressions 934, are formed on the partition walls 931, and thus the vertical movement of the pickers $920_C$ to $920_J$ is restricted. Furthermore, division mounters 933-R and 933-L are provided in respective end portions of the kit 930 so that the unused four remaining pickers $920_A$, $920_B$, $920_K$ and $920_L$ can be divided into two groups and can be mounted.

As described above, the pick-and-place modules for test handler according to the present invention can be applied to customer trays, having different loading capacities, by replacing only the kits, so that the reuse rate of resources can be increased, with the result that the consumption of resources can be prevented and, in addition, the replacement cost can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A pick-and-place module for test handlers, comprising:
a main body having N vacuum paths (where N is plural); and
a kit having M pickers and M vacuum passages (where $1 \leq M \leq N$), the M pickers being provided so as to respectively communicate with the M vacuum passages,
wherein the M vacuum passages are formed to respectively communicate with all or some of the N vacuum paths formed in the main body, and the M pickers hold semiconductor devices or release the held semiconductor devices using vacuum pressures formed inside of M vacuum passages and N vacuum paths in respective communication,
wherein the kit is detachably mounted to the main body,
wherein remaining vacuum paths other than the all or some of the N vacuum paths among the N vacuum paths are closed by an upper surface of the kit when the kit is mounted to the main body so that the remaining vacuum paths do not and when the pick-and-place module is formed by coupling a plurality of the pick-and place modules to each other, an intermediate pick-and-place module is formed such that the main body and the kit thereof has an "I" shape.

2. The pick-and-place module as set forth in claim 1, wherein, the pick-and-place modules, which are arranged on both sides of the intermediate pick-and-place module, are formed such that main bodies and kits thereof have a "]" shape or a "[" shape.

3. The pick-and-place module as set forth in claim 1, wherein the M pickers are configured such that a first picker and M-th picker among the M pickers are in a straight line to a first vacuum path and a N-th vacuum path, respectively.

* * * * *

UNITED STATES PATENT AND TRADEMARK OFFICE
CERTIFICATE OF CORRECTION

PATENT NO. : 8,146,969 B2
APPLICATION NO. : 12/784148
DATED : April 3, 2012
INVENTOR(S) : Dong Hyun Yo and Hyun Song

It is certified that error appears in the above-identified patent and that said Letters Patent is hereby corrected as shown below:

Title Page, Item (57)
In the Abstract, "A pick-and-place module for test handlers includes a main body, and a kit. The main body has N-th vacuum paths (where N is plural). The kit has M-th pickers. The M-th pickers are provided so as respectively correspond to M-th vacuum path parts (where $1 \leqq M \leqq N$), which are formed to respectively correspond to all or some of the N-th vacuum paths formed in the main body, and holds semiconductor devices or releasing the held semiconductor devices using vacuum pressures. The kit is detachably mounted to the main body" should read -- A pick-and-place module for test handlers includes a main body, and a kit. The main body has N-th vacuum paths (where N is plural). The kit has M-th pickers. The M-th pickers are provided so as respectively correspond to M-th vacuum passages (where $1 \leq M \leq N$), which are formed to respectively correspond to all or some of the N-th vacuum paths formed in the main body, and holds semiconductor devices or releasing the held semiconductor devices using vacuum pressures. The kit is detachably mounted to the main body --.

Claim 1, Column 8, Line 22, "$1 \leqq M \leqq N$" should read -- $1 \leq M \leq N$ --.

Claim 1, Column 8, Lines 32-40, "wherein remaining vacuum paths other than the all or some of the N vacuum paths among the N vacuum paths are closed by an upper surface of the kit when the kit is mounted to the main body so that the remaining vacuum paths do not and when the pick-and-place module is formed by coupling a plurality of the pick-and-place modules to each other, an intermediate pick-and-place module is formed such that the main body and the kit thereof has an "I" shape." should read -- wherein remaining vacuum paths other than the all or some of the N vacuum paths among the N vacuum paths are closed by an upper surface of the kit when the kit is mounted to the main body so that the remaining vacuum paths do not communicate with any one of the M vacuum passages, and when the pick-and-place module is formed by coupling a plurality of the pick-and-place modules to each other, an intermediate pick-and-place module is formed such that the main body and the kit thereof has an "I" shape --.

Signed and Sealed this
Eighth Day of May, 2012

David J. Kappos
*Director of the United States Patent and Trademark Office*